United States Patent
Kwon et al.

Patent Number: 5,264,845
Date of Patent: Nov. 23, 1993

[54] KEY SCAN CIRCUIT AND METHOD IN A MICROCOMPUTER SYSTEM

[75] Inventors: Sun-don Kwon, Seoul; Hyeon-su Kim, Kyunggi, both of Rep. of Korea

[73] Assignee: SamSung Electronics Co., Ltd., Suwon, Rep. of Korea

[21] Appl. No.: 766,777

[22] Filed: Sep. 27, 1991

[30] Foreign Application Priority Data

Oct. 27, 1990 [KR] Rep. of Korea ............. 90-17286

[51] Int. Cl.⁵ ............................................. H03M 11/20
[52] U.S. Cl. ........................................ 341/26; 341/24; 341/25
[58] Field of Search ............ 341/26, 22, 24, 25; 400/477, 479; 364/189, 209.09, 209.12; 178/17 C

[56] References Cited

U.S. PATENT DOCUMENTS 4,231,016 10/1980 Ueda ............................ 341/24 X
5,059,974 10/1991 Wu ............................... 341/26 X Primary Examiner—Donald J. Yusko
Assistant Examiner—Michael Horabik
Attorney, Agent, or Firm—Robert E. Bushnell

[57] ABSTRACT

A key scan circuit and the method thereof in a microcomputer is disclosed which requires no diode for preventing circuit short and performs key check or automatic operations with a simplified circuit structure. The key scan method includes a step of designating the input/output mode of a bilateral port by a data direction register in a microcomputer which includes an input/output bilateral port and an input only unilateral port, so as to prevent circuit shorts when more than one key are pushed. Further, by using first and second memories, the key scan method includes a step of determining whether the number of logic low states in the first memory is greater than one, and determining whether the number of logic high states stored in the second memory is greater than one, thus indicating the pressing of multiple keys. Then, the pushed key's value is determined by a predetermined formula by obtaining the value m when the mth bit value of the first memory is logic low, and the value n when the nth bit value of the second memory is logic high.

12 Claims, 6 Drawing Sheets

KEY SCAN CIRCUIT AND METHOD IN A MICROCOMPUTER SYSTEM

BACKGROUND OF THE INVENTION

The present invention relates to a key scan circuit and the method adapted in a microcomputer system utilizing a bilateral port, and more particularly to a key scan circuit and the method thereof which requires no diode for preventing a circuit short during a key scan operation, and performs key check and automatic system operations with a simplified circuit structure.

In a conventional key scan circuit as disclosed in the same applicant's Korean Patent Publication No. 89-2297, signals sensed in a key matrix circuit 3 are fed to data input ports D0-D2 of a microprocessor 1 through a multiplexer 4 as shown in FIG. 1. In FIG. 1, output ports P0, P1, P2 and P3 of microprocessor 1 are respectively coupled to input terminals a, b, c and d of demultiplexer 2, then falling pulses from output terminals O-F of demultiplexer 2 are sequentially supplied to each row scan lines Y0-Y15 of matrix circuit 3. Thereafter, the data of column scan lines X0-X7 of the matrix circuit 3 are inputted to input terminals 0-7 of multiplexer 4 of which the outputs Q0-Q2 are input to the data input ports D0-D2 of microprocessor 1 to scan the keyboard. Accordingly, the conventional key scan circuit checks keys by directly driving ports, requiring additional circuitry such as a demultiplexer and a data buffer, plus requires an additional circuit composed of diodes to guard against shorts at the ports when two or more keys are simultaneously pressed.

SUMMARY OF THE INVENTION

Therefore, it is an object of the present invention to provide a key scan circuit and method thereof to allow simplified key processing in a microcomputer by the use of a bilateral port, thereby requiring no diodes for circuit short prevention, and performing key-check and automatic turning on the system with a simplified circuitry.

To attain the object, there is provided a key scan circuit in a microcomputer system consisting of a keypad having an m×n key matrix, and a microcomputer for recognizing a keying operation from the keypad, the key scan circuit comprising:

a first port for directly receiving m row signals from the keypad through row scan lines into the microcomputer;

a first memory for storing the logic value of the m row signals supplied to the first port logically multiplied by the previously stored logic value;

a second port for directly receiving n column signals from the keypad through column scan lines into the microcomputer;

a data direction register for setting each bit of n units of the second port so as to be used as an input or an output;

a second memory for storing the logic value of n column signals input to the second port logically summed with the logic values of the data direction register; and a pull-up resistor portion for supplying a reference logic value to the m×n key matrix circuit.

To attain the object, there is provided a key scan method in a microcomputer system including a keypad having m×n key matrix circuit, a first and second ports for processing m×n row and column signals, an m-bit first memory and an n-bit second memory for storing the logic values corresponding to the first and second ports, and a data direction register for setting each bit of the second port so as to be used as an input or an output, corresponding to the second port, the key scan method comprising the steps of:

initializing the microcomputer system by establishing the first port as an input port and assigning predetermined logic values to the second port, the first and second memories, and the data direction register;

scanning each bit of the data direction register when any one key in the keypad having m×n key matrix circuit is pressed;

storing into the first memory the current logic value of the m-bit first memory logically multiplied by the current logic value of the first port, and storing into the second memory the current logic value of the n-bit second memory logically summed with the current logic value of the data direction register, by repeating the scanning process until a carry bit of the data direction register becomes 1;

determining whether or not the number of logic "0's" of the current logic values stored in the respective bits of the first memory is greater than one or whether or not the number of logic "1's" of the current logic values stored in the respective bits of the second memory is greater than one;

proceeding to an operation end step after recognizing an error by checking that a plurality of keys are pressed if the number of logic either "0's" or "1's" is larger than one in the number determining process; and key-processing by calculating the defined value of the pressed key according to a predetermined formula if the number of logic neither "0's" nor "1's" is larger than one in the number determining process.

BRIEF DESCRIPTION OF THE DRAWINGS

The above object and other advantages of the present invention will become more apparent by describing in detail a preferred embodiment of the present invention with reference to the attached drawings in which.

DETAILED DESCRIPTION OF THE INVENTION

A preferred embodiment of the present invention follows with reference to the attached drawings.

Figure 1:
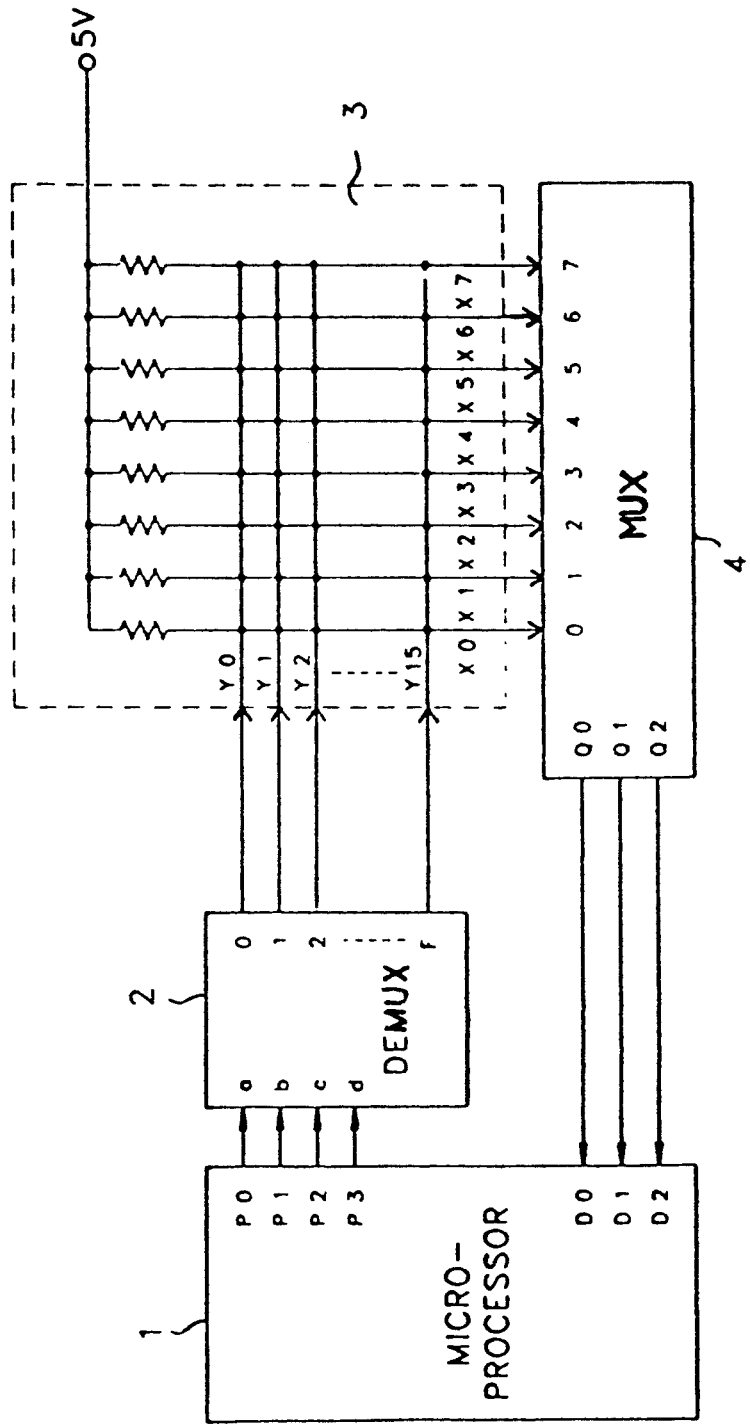
FIG. 1 is a schematic circuit diagram of a conventional key scan circuit.
Figure 2:
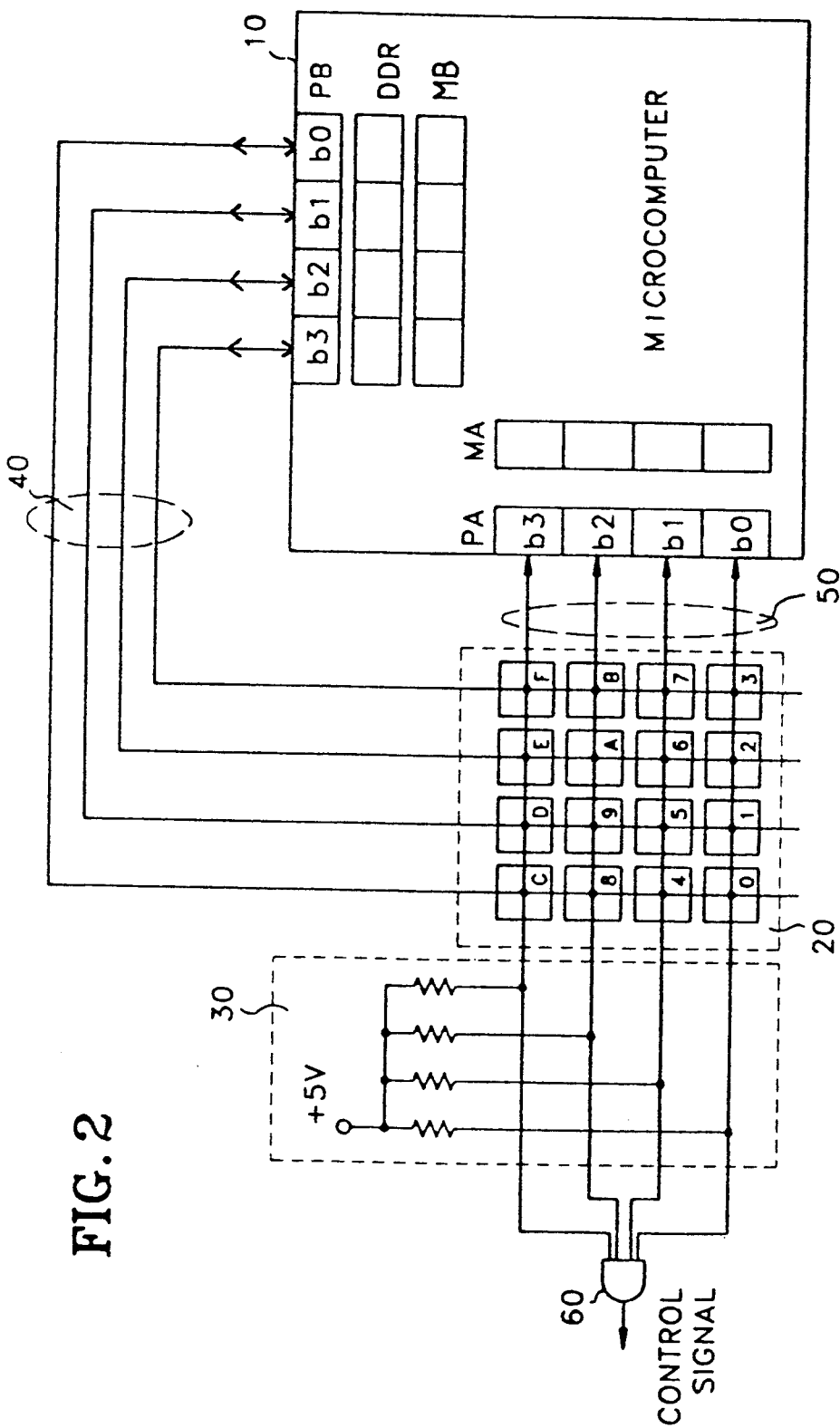
FIG. 2 is a schematic circuit diagram showing a preferred embodiment of a key scan circuit according to the present invention.

Referring to FIG. 2, in the key scan circuit of the microcomputer system according to the present invention, a keypad 20 having an m×n key matrix circuit is connected directly to microcomputer 10 via row scan lines 50 and column scan lines 40, without additional circuitry such as the demultiplexer of the conventional circuit. A preferred embodiment of the present invention will be explained with keypad 20 having a key matrix circuit composed of a 4×4 key matrix, that is, 16 keys from O through F. A microcomputer 10 comprises a first port PA having 4 bits b0, b1, b2 and b3 for receiving a 4-bit row signal via row scan lines 50 when any key is pressed on keypad 20; a first memory MA for storing the logic value of the 4-bit row signal input to the first port PA logically multiplied by the previously stored logic value therein; a second port PB having 4 bits b0, b1, b2 and b3 for outputting, the 4-bit column signal from the keypad 20 via column scan lines 40; a data direction register DDR for setting each bit of the second port PB to the input or output mode; a second memory MB for storing the logic value of the 4-bit column signal input to the second port PB logically summed with the logic value of each bit of a data direction register DDR. Pull-up resistor portion 30 for supplying a reference logic value to keypad 20 is coupled to the keypad 20 and an AND gate 60. The AND gate 60 provides a logical product of the signals output from keypad 20, to be used as a control signal for performing an automatic on/off function of the microcomputer system or for supplying a key check signal.

The operation of the above key scan circuit according to the present invention will be described below in detail with reference to FIG. 3 which is a flowchart of a key scan method of a microcomputer system according to the present invention.

Figure 3:
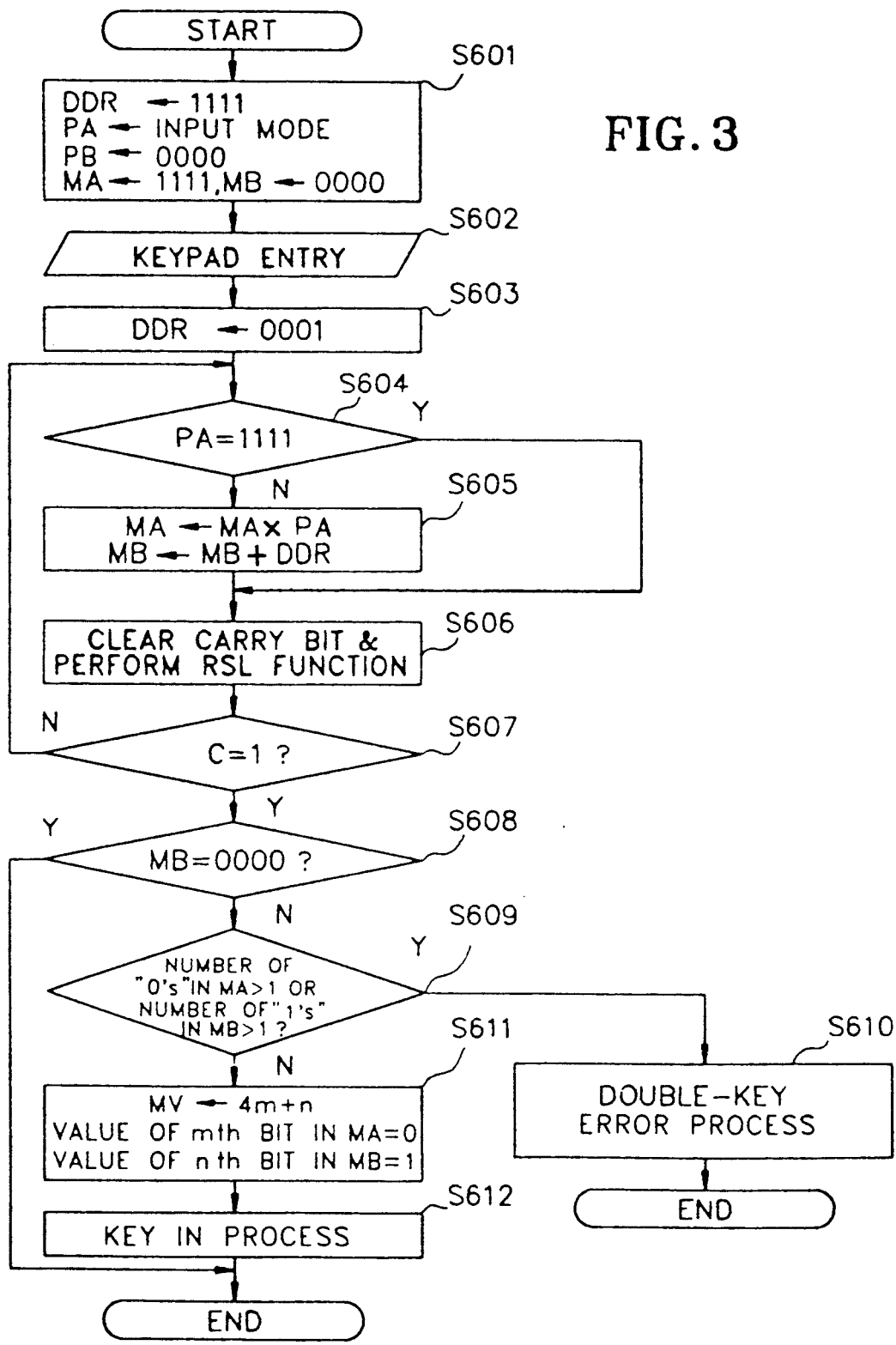
FIG. 3 is a flow chart diagram for explaining the key scan method of the key scan circuit shown in FIG. 2.

Referring to FIG. 3, the key scan method in the microcomputer system initializes certain parameters in order to check for the pressing of a key on keypad 20. This is accomplished in step S601 by setting the first port PA to an input-only mode and establishing the values of the respective bits in the second port PB, the first and second memories MA and MB, and the data direction register DDR, with '0000', '1111', '0000' and '1111', respectively. Here, each bit of the bilateral port PB is designated as an output mode when the value of the corresponding bit of the data direction register DDR is '1', and each bit of the bilateral port PB is designated as an input mode when the value of the corresponding bit of the data direction register DDR is '0'.

Figure 4:
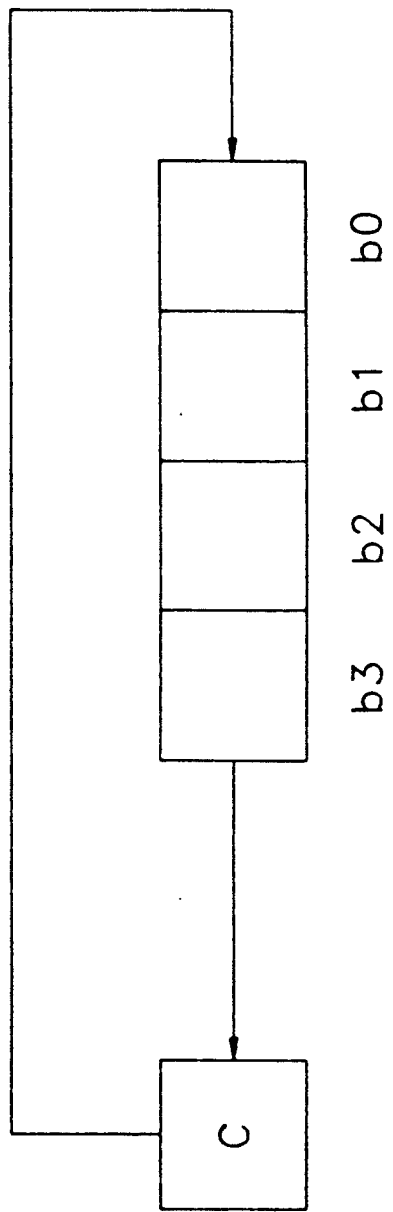
FIG. 4 illustrates the rotation shift left operation of the data direction register shown in FIG. 2.

Step S602 represents a user function. If the user presses one or more keys in step S602, the program advances to step S603 in order to check which key is pressed. In step S603, the data direction register DDR is set to '0001' to begin checking the keys from the first column. This particular operation means that b3, b2, and b1 of the second port PB are in the input mode, and b0 is in the output mode. If any keys in that column have been pressed, they are found in step S604, where the first port PA is checked against the value "1111" which corresponds to the pull-up resisters 30. If PA matches "1111", it is determined that none of the input port bits are pulled low, and no pressed key exists in that column. Then, the program proceeds to step S606, where data direction register DDR clears a carry bit value C and performs a rotate shift left, i.e., RSL function in order to check the next column as shown in FIG. 4.

Meanwhile, if step S604 shows PA to be other than "1111", the decision process determines that at least one key has been pressed in step S602, and advances to step S605 where the microprocessor 10 carries out two logic functions: first, the current value of first memory MA is multiplied by the logic value of first port PA, then restored into MA, and secondly, the current value of second memory MB is summed with the logic value of data direction register DDR, then restored into MB.

After step S605, the carry bit is cleared and a rotate shift left function is done by the data direction register DDR in step S606.

Step S607 checks if carry bit value C equals one. This occurs when the data direction register DDR, set to "0001" in step S603, has completed four rotate shift left functions and all columns have been scanned. Steps S604, S605, and S606 are repeated until C=1.

After key-scanning, steps S608 and S609 decide how many, if any, keys are pressed. If C=1 in step S607, it is determined whether the second memory MB is still set to "0000" in step S608. If MB=0000 in step S608, the operation is complete with no pressed keys being detected. However, if MB≠0000 in step S608, the operation moves to step S609 to determine if there has been a double-key error. If more than one logic "0's" appear in first memory MA, or if more than one logic "1's" are present in second memory MB, step S609 judges that multiple keys are being pushed, and then the operation advances to step S610 and performs an error process, and then completes the operation.

In the meantime, if there is only one "0" in MA and one "1" in MB in step S609, step S611 defines the key's value with the formula: 4m+n=MV which allows S612 to key in and terminate the procedure. Here, MV denotes the key's value, m corresponds to a value of m when the mth bit of first memory MA is a logic "0", and n corresponds to a value of n when the nth bit second memory MB is a logic "1".

For example, if the 9th key of the keypad's matrix is pushed in step S602, "1011" is fed to the first port PA. In doing so, the value "1111", initialized MA set in step S601, is logically multiplied by the value "1011", i.e., the currently held input value of PA, and the product "1011" is stored in the first memory MA. Second memory MB calculation is executed by logically summing the value "0000", initialized MB set in step S601, with the value "0010", i.e., the current state of DDR, and the result "0010" is stored in the second memory MB. Thus, as m becomes two via bit b2 and n becomes one via bit b1, MV is figured to be nine, or the 9th key in the matrix.

The logic values of row and column signals which are values of the row-column signal of the key are stored in each bit of the first and second memories MA and MB by scanning keys during steps S603 to S607. The reason to set the value '0001' at the data direction register DDR in step S603 is to scan the keypad 20 from the first column, thereby preventing short circuits by designating the bits b3, b2 and b1 of the bilateral second port PB to be in the input mode when multiple keys are pushed at the same time. Tn step S604, whether or not a key of each column is pushed is checked, and in step S605, the signal indicating the location of the pushed key is stored in each of memories MA and MB. Tn step S606, the value of the data direction register DDR is shifted to check the next column, and in step S607, whether or not a carry bit is generated is checked to determine whether or not the scan is completed. Step S608 checks that any key is not pushed if the value of the second memory MB is unchanged, and step S609 determines whether or not more than one key is pushed if the bit values of the first and second memories MA and MB have changed. At this time, if more than one key is pushed, it is processed as an error or a double-key in step S610, and if only one key is pushed, step S611 indicates which key is pressed.

The method of detecting which key is pushed comes out of the bit value stored in the first and second memories MA and MB. In the example of FIG. 2, the bit value varies according to the sequence 0→4→8→C. This is a simplified structure, showing the bit value changing in multiples of 4. If the bit b0 of the first memory MA changes at bit b0 column of the second port PB, the key value is defined as "0" according to the formula MV=4m+n. If bit b1 of the first memory MA changes at the same bit column as above, the key value is defined as "4". According to the same method, if the bit b2 of MA and the bit b1 of MB change, it is indicated by 4×2+1=9 as m=2 and n=1 are substituted in the formula, that is, 9th key is pushed.

Figure 5A:
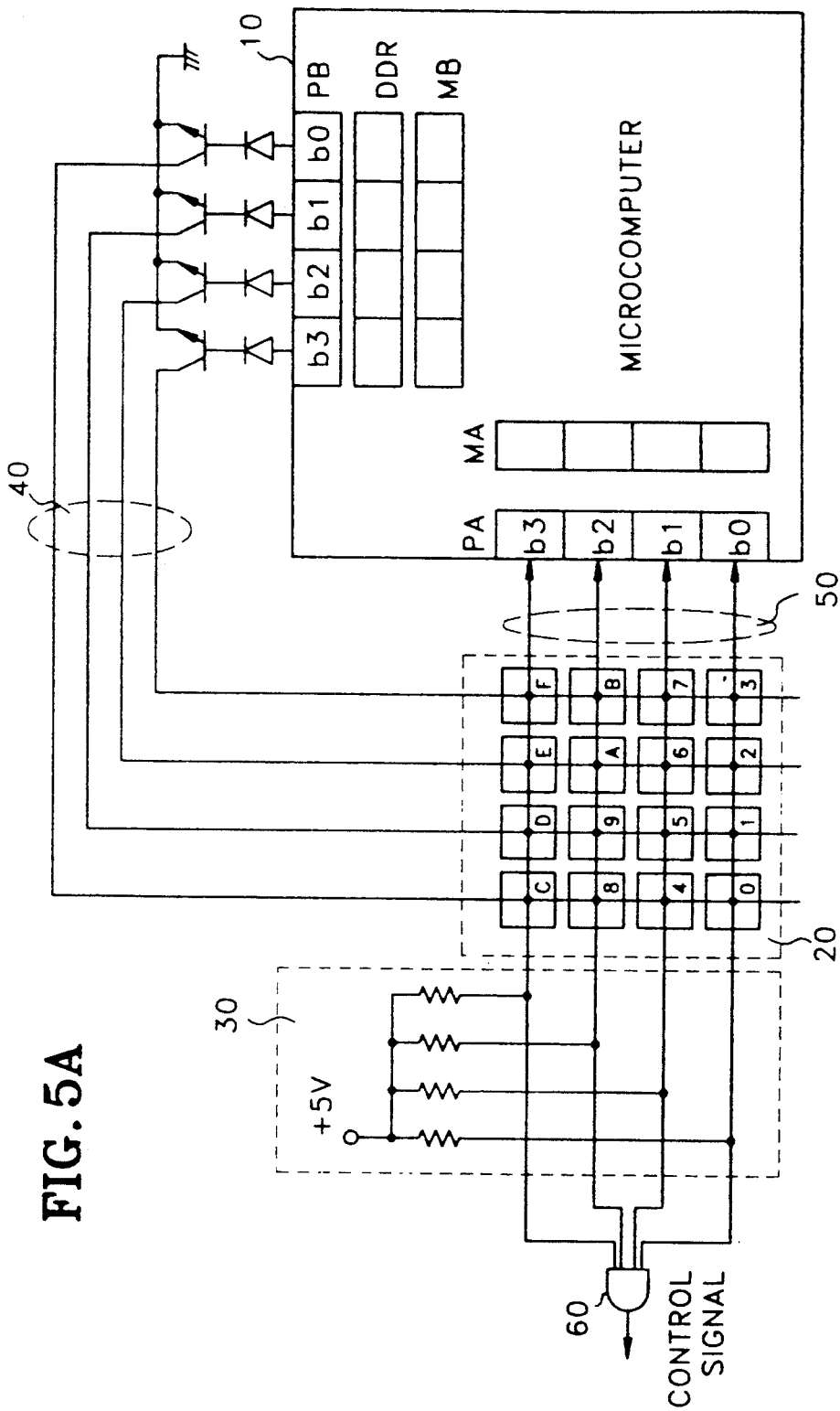
FIGS. 5A and 5B are schematic circuit diagrams showing two more embodiments of the bilateral port used in the key scan circuit of the microcomputer system according to the present invention.
Figure 5B:
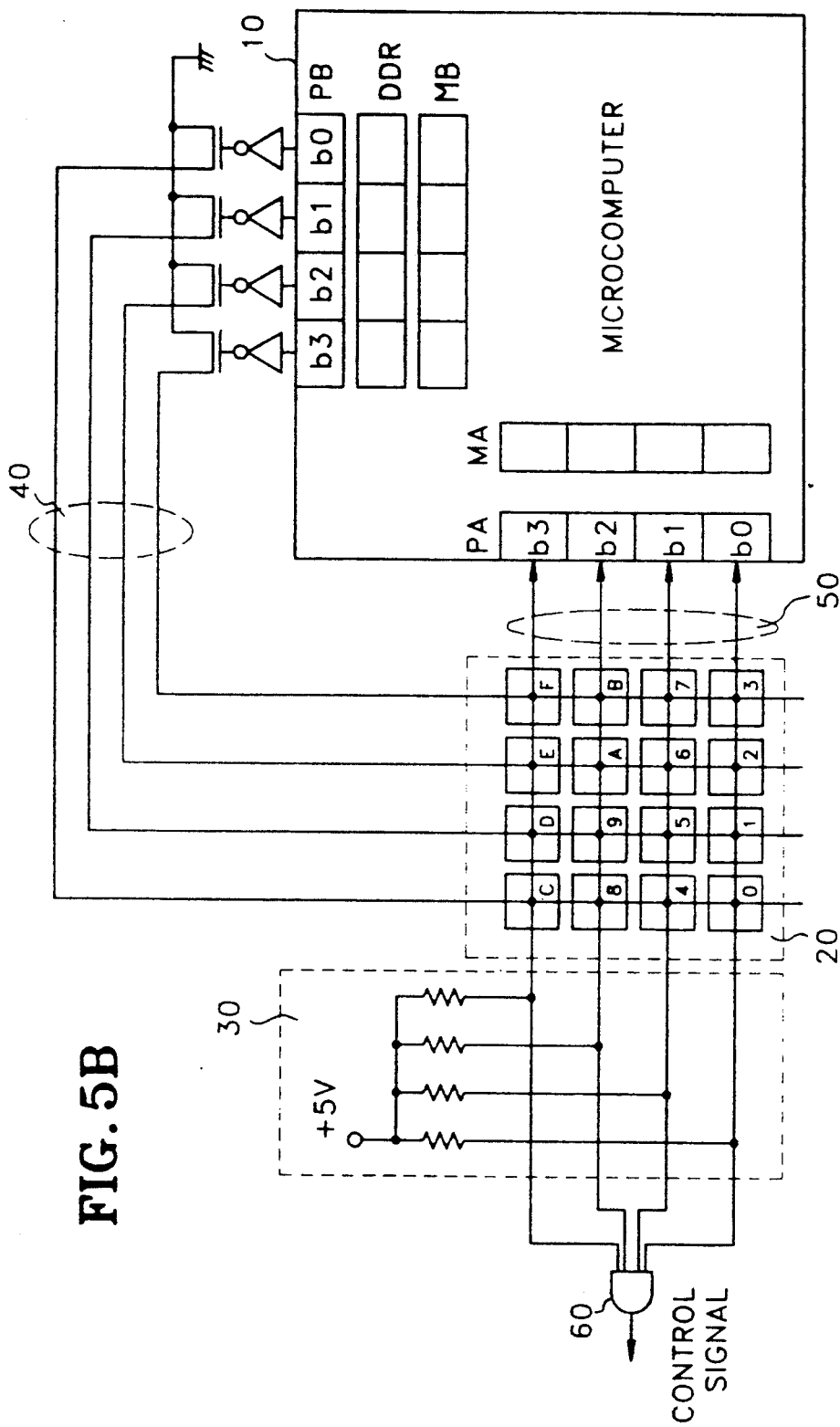

Two additional embodiments of the key scan circuit of a microcomputer system according to the present invention are shown in FIGS. 5A and 5B. The embodiments use open-collector and open-drain transistors, respectively, positioned along the column scan lines, instead of using a bilateral port such as the second port PB in the microcomputer, thereby obtaining the same effect as the bilateral port.

The operation of the embodiments is such that if a "high" is fed to the input port, of an inverter, the collector of the transistor is open, and if a "low" is input, the collector of transistor goes low to properly set the value in the data direction register, just as in the bilateral port, thereby preventing circuit shorts.

Further, as shown in FIG. 2, by adding an AND gate 60 to the output of the key scan circuit in each embodiment of the present invention, a logical product of the logic signals applied to each port may be used as a control signal for automatically turning on the system whenever a key is pushed, or for a key processing function.

As described above in detail, the key scan circuit and the method thereof of the microcomputer system properly sets the logic value of the data direction register having a bilateral port or an open collector transistor, thereby preventing circuit shorts caused when multiple keys are pushed, and eliminating excess circuitry.

What is claimed:

1. A key scan circuit for a microcomputer system consisting of a keypad having an m by n key matrix circuit and a microcomputer for recognizing keying operation from the keypad, the key scan circuit comprising:
   first port means for directly receiving m row signals form said keypad through row scan lines in said microcomputer;
   first memory means for storing a first logic value of the m row signals input to said first port means logically multiplied by a currently stored logic value;
   second port means for directly receiving n column signals from said keypad through column scan lines in said microcomputer;
   data direction register means for setting each bit of n units of said second port means so as to be used as one of an input and an output;
   second memory means for storing a second logic value of the n column signals input to said second port means logically summed with a third logic value in said data direction register means; and
   resistor means for supplying a reference logic signal value to said m by n key matrix circuit.

2. The key scan circuit for a microcomputer as claimed in claim 1, further comprises of a key value of a first column at a row in the key matrix circuit of said keypad being a multiple of four.

3. The key scan circuit for a microcomputer as claimed in claim 1, further comprises of m equaling four and n equaling four.

4. The key scan circuit for a microcomputer as claimed in claim 1, further comprising an AND gate connected to an output terminal of said key matrix circuit.

5. The key scan circuit for a microcomputer as claimed in claim 1, further comprising said second port mans being formed of open-collector type bipolar transistors.

6. The key scan circuit for a microcomputer as claimed in claim 1, further comprising said second port means being formed of open-drain type metal oxide semiconductor transistors.

7. A key scan method of a microcomputer comprising a keypad having an m by n key matrix circuit, first and second ports for processing m by n row and column signals, a first memory and a second memory for storing the logic values corresponding to said first and second ports, and a data direction register for setting each bit of said second port to enable the second port to be used as one of an input port and an output port, said key scan method comprising the steps of:
   initializing said microcomputer by setting said first port sa the input port and assigning predetermined logic values to said second port, said first and second memories, and said data direction register;
   scanning each bit of said data direction register when a key of said m by n matrix keypad is pressed;
   stored into the first memory, a logical product of a first current logic value of said first memory and a second current logic value of said first port, and storing into said second memory, a logical sum of a third current logic value of said second memory and a fourth current logic value of said data direction register, and repeating the scanning and storing steps until a carry bit of the data direction register becomes logic high;
   determining whether a current number of logic lows in said first memory is greater than one and whether a current number of logic highs in said second memory is greater than one; and
   error processing and completing the key scan method after checking whether multiple keys are pushed when the determining step determines that one of the current number of logic lows in said first memory is greater than one and the current number of logic highs in said second memory is greater than one, and determining a key value by a predetermined formula if said one of the current number of logic lows and the current number of logic highs is not larger than one.

8. The key scan method of a microcomputer as claimed in claim 7, wherein said initialization step comprises the step of designating said second port as the output port.

9. The key scan method of a microcomputer as claimed in claim 7, further comprised of when m equals four and n equals four, the predetermined formula in the error processing step is MV=4A+B, where A is a value of a bit in the first memory corresponding to the pressed key, B is a value of a bit in the second memory corresponding to the pressed key, and MV is the key value.

10. A key scan method of a microcomputer comprising a keypad having an m×n key matrix circuit, a first port having m bits and a second port having n bits for processing m×n row and column signals, a first memory and a second memory for storing logic values corresponding to said first and second ports, and an n-bit data direction register for setting each of the n bits of said second port as one of an input bit and an output bit, said key scan method comprising the steps of:

initializing said microcomputer by presetting to predetermined logic states the m bits of said first port, the n bits of the second port, said first and second memories, and said data direction register;

scanning each bit of said data direction register when a key of said keypad is pressed;

deciding whether a current input value of said first port matches one of said predetermined logic values and if the current input value matches the one of said predetermined logic values, clearing a carry bit of the data direction register to perform a rotate-shift left function to the n bits of said second port and, if the current input value does not match the one of said predetermined logic values, storing in said first memory a product of a current logic value of the first memory and a current logic value of said first port, storing in said second memory a logical sum of a current logic value of the second memory and a current logic value of said data direction register, and clearing the carry bit of said data direction register by the rotate-shift left function, and sequentially repeating the scanning and deciding steps until the carry bit becomes logic high; and determining whether a current logic value of the second memory matches said predetermined logic values when the carry bit becomes logic high, and if matched, completing the key scan method, and if not matched, determining whether a number of current logic lows stored in said first memory is greater than one, and whether a number of current logic highs stored in said second memory is greater than one;

if one of the number of current logic lows stored in said first memory is greater than one, and the number of current logic highs stored in said second memory is greater than one, then more than one key is pushed, an error message is processed, and the key scan method is completed; and if one of the number of current logic lows stored in said first memory is not greater than one and the number of current logic highs stored in said second memory is not greater than one, then a key value is determined according to a predetermined formula.

11. A key scan system comprising:

a keypad having m rows, connected to a logic level source having a predetermined logic level, and n columns of keys; and a microcomputer comprising a first port with m input bits corresponding to m row scan lines connected to said m rows of the keypad, a first memory with m first memory bits corresponding to a previous said m input bits, a second port with n input/output bits corresponding to n column scan lines connected to said n columns of the keypad, a second memory with n second memory bits corresponding to a previous said n input/output bits, and a data direction register with n bits corresponding to said n input/output bits of the second port for selecting each of said n input/output bits as one of an input bit and an output bit, said microcomputer detecting an activated key of the keypad located at a column corresponding to a selected output bit of the second port and a selected said m input bit, which does not equal the predetermined logic level, corresponding to a key-activated row.

12. A key scan method comprising the steps of:

initializing in a microcomputer an input port to an input mode, a bilateral port to a first predetermined logic value, a first memory corresponding to the input port to a second predetermined logic value, a second memory corresponding to the bilateral port to a third predetermined value, and a data direction register for controlling each bit of the bilateral port as one of input and output to a fourth predetermined value;

when a key of a keypad having rows and columns is activated, scanning each bit of said data direction register corresponding to each of said columns to determine an activated column of said columns of the keypad;

scanning each of said rows for each of said columns scanned to determine an activated row when a bit of the input port does not equal a predetermined input bit;

detecting said activated key of the keypad positioned at the activated column and the activated row;

determining whether a current number of logic lows corresponding to a number of activated rows in said first memory is greater than one and whether a current number of logic highs corresponding to a number of activated columns in said second memory is greater than one; and determining an error if one of the current number of logic lows in said first memory is greater than one and the current umber of logic highs in said second memory is greater than one.

* * * * *

UNITED STATES PATENT AND TRADEMARK OFFICE
CERTIFICATE OF CORRECTION

PATENT NO. : 5,264,845
DATED : November 23, 1993
INVENTOR(S) : Sun-don Kwon, et al.

It is certified that error appears in the above-indentified patent and that said Letters Patent is hereby corrected as shown below:

Column 4,

Line 55,      change "Th" to --In--;

Column 6,

Line 10,      change "mans" to --means--; and

Line 26,      change "sa" to --as--.

Signed and Sealed this

Twenty-third Day of August, 1994

Attest:

BRUCE LEHMAN

*Attesting Officer*      *Commissioner of Patents and Trademarks*